(12) United States Patent
Sugibayashi et al.

(10) Patent No.: US 8,354,861 B2
(45) Date of Patent: Jan. 15, 2013

(54) MAGNETORESISTIVE ELEMENT, LOGIC GATE AND METHOD OF OPERATING LOGIC GATE

(75) Inventors: Tadahiko Sugibayashi, Tokyo (JP); Noboru Sakimura, Tokyo (JP); Ryusuke Nebashi, Tokyo (JP)

(73) Assignee: NEC Corporation, Tokyo (JP)

( * ) Notice: Subject to any disclaimer, the term of this patent is extended or adjusted under 35 U.S.C. 154(b) by 12 days.

(21) Appl. No.: 13/060,574

(22) PCT Filed: Aug. 12, 2009

(86) PCT No.: PCT/JP2009/064262
§ 371 (c)(1),
(2), (4) Date: Feb. 24, 2011

(87) PCT Pub. No.: WO2010/024126
PCT Pub. Date: Mar. 4, 2010

(65) Prior Publication Data
US 2011/0148458 A1      Jun. 23, 2011

(30) Foreign Application Priority Data
Aug. 25, 2008   (JP) ................................ 2008-215184

(51) Int. Cl.
*H01L 25/00* (2006.01)
*H03K 19/00* (2006.01)
*H03K 19/20* (2006.01)
*H03K 19/094* (2006.01)
*G11C 11/00* (2006.01)
*G11C 11/14* (2006.01)

(52) U.S. Cl. .......... 326/101; 326/38; 326/112; 365/158; 365/171

(58) Field of Classification Search .............. 326/37–41, 326/101, 104, 112, 119; 365/171, 158, 145; 307/407, 408, 415
See application file for complete search history.

(56) References Cited

U.S. PATENT DOCUMENTS

| | | | | |
|---|---|---|---|---|
| 6,034,887 | A  * | 3/2000 | Gupta et al. .................. | 365/171 |
| 7,057,921 | B2 * | 6/2006 | Valet ............................. | 365/158 |
| 7,110,287 | B2 * | 9/2006 | Huai et al. .................... | 365/171 |
| 7,379,321 | B2 * | 5/2008 | Ravelosona et al. .......... | 365/145 |
| 7,486,551 | B1 * | 2/2009 | Li et al. ......................... | 365/173 |
| 7,652,398 | B2 * | 1/2010 | Koch et al. .................... | 307/407 |
| 8,039,913 | B2 * | 10/2011 | Zheng et al. .................. | 257/421 |
| 8,040,154 | B2 * | 10/2011 | Chua-Eoan et al. ........... | 326/40 |
| 8,058,906 | B2 * | 11/2011 | Niemier et al. ............... | 326/104 |
| 2009/0218645 | A1 * | 9/2009 | Ranjan et al. ................. | 257/421 |
| 2011/0292718 | A1 * | 12/2011 | Suzuki et al. ................. | 365/158 |
| 2012/0134199 | A1 * | 5/2012 | Zhu et al. ...................... | 365/158 |
| 2012/0205758 | A1 * | 8/2012 | Jan et al. ....................... | 257/421 |

OTHER PUBLICATIONS

International Search Report for PCT/JP2009/064262 mailed Oct. 20, 2009.

* cited by examiner

*Primary Examiner* — Shawki Ismail
*Assistant Examiner* — Dylan White

(57) ABSTRACT

A logic gate has a magnetoresistive element, a magnetization state control unit and an output unit. The magnetoresistive element has a laminated structure having N (N is an integer not smaller than 3) magnetic layers and N−1 nonmagnetic layers that are alternately laminated. A resistance value of the magnetoresistive element varies depending on magnetization states of the N magnetic layers. The magnetization state control unit sets the respective magnetization states of the N magnetic layers depending on N input data. The output unit outputs output data that varies depending on the resistance value of the magnetoresistive element.

16 Claims, 16 Drawing Sheets

Fig. 9

| PATTERN | P1 | P2 | P3 | P4 |
|---|---|---|---|---|
| INPUT DATA | A=1, B=1 | A=0, B=1 | A=1, B=0 | A=0, B=0 |
| MAGNETIZATION STATE | R1=RL, R2=RL | R1=RH, R2=RL | R1=RH, R2=RH | R1=RL, R2=RH |
| RESISTANCE VALUE | R=2RL | R=RH+RL | R=2RH | R=RL+RH |
| OUTPUT DATA | Q=0 | Q=1 | Q=1 | Q=1 |

Fig. 11

| PATTERN | P5 | P6 | P7 | P8 |
|---|---|---|---|---|
| INPUT DATA | A=1, B=1 | A=0, B=1 | A=1, B=0 | A=0, B=0 |
| MAGNETIZATION STATE | R1=RL R2=RH | R1=RH R2=RH | R1=RH R2=RL | R1=RL R2=RL |
| RESISTANCE VALUE | R=RL+RH | R=2RH | R=RH+RL | R=2RL |
| OUTPUT DATA | Q=1 | Q=1 | Q=1 | Q=0 |

Fig. 13

|    | A | B | C | Q |
|----|---|---|---|---|
| P1 | 1 | 1 | 1 | 0 |
| P2 | 0 | 1 | 1 | 1 |
| P3 | 1 | 0 | 1 | 1 |
| P4 | 0 | 0 | 1 | 1 |
| P5 | 1 | 1 | 0 | 1 |
| P6 | 0 | 1 | 0 | 1 |
| P7 | 1 | 0 | 0 | 1 |
| P8 | 0 | 0 | 0 | 0 |

40

MAGNETORESISTIVE ELEMENT, LOGIC GATE AND METHOD OF OPERATING LOGIC GATE

TECHNICAL FIELD

The present invention relates to a magnetoresistive element, a logic gate using the magnetoresistive element, and a semiconductor integrated circuit provided with the logic gate.

BACKGROUND ART

A typical magnetoresistive element has a magnetization fixed layer whose magnetization direction is fixed, a magnetization free layer whose magnetization direction is reversible, and a nonmagnetic layer sandwiched by the magnetization fixed layer and the magnetization free layer. In a case where the nonmagnetic layer is a thin insulating layer, the magnetoresistive element is called a TMR (Tunnel MagnetoResistance) element or an MTJ (Magnetic Tunnel Junction) element. A resistance value of the magnetoresistive element varies depending on whether magnetization directions of the magnetization fixed layer and the magnetization free layer are parallel or anti-parallel to each other. A memory that nonvolatilely stores a data by utilizing such a change in the resistance value of the magnetoresistive element is a magnetic random access memory (MRAM: Magnetic Random Access Memory).

Meanwhile, a logic device using such a magnetoresistive element is proposed (refer, for example, to Japanese Patent Publication JP-2004-6775, Japanese Patent Publication JP-2005-235307, Japanese Patent Publication JP-2006-24714, Japanese Patent Publication JP-2008-99284 and Japanese Patent Publication JP-2006-526907). Japanese Patent Publication JP-2004-6775 among them describes a logic gate (magnetic logic element) that can achieve various logic functions by using a magnetoresistive element.

FIG. 1 schematically shows a configuration of a magnetic logic element 100 described in the Japanese Patent Publication JP-2004-6775. The magnetic logic element 100 has two magnetoresistive elements 110 and 120, and the two magnetoresistive elements 110 and 120 are laminated across an intermediate section SP. The first magnetoresistive element 110 has a laminated structure that a hard magnetic section HM1, a spin transfer intermediate section NM1 and a soft magnetic section SM1 are laminated. On the other hand, the second magnetoresistive element 120 has a laminated structure that a hard magnetic section HM2, a spin transfer intermediate section NM2 and a soft magnetic section SM2 are laminated. The hard magnetic sections HM1 and HM2 each corresponds to the magnetization fixed layer whose magnetization direction is fixed. On the other hand, the soft magnetic sections SM1 and SM2 each corresponds to the magnetization free layer whose magnetization direction is not fixed. The soft magnetic sections SM1 and SM2 are provided on both sides of the intermediate section SP.

The magnetization directions of the soft magnetic sections SM1 and SM2 are controlled by a spin transfer method. According to the spin transfer method, a current is supplied in a perpendicular direction between the soft magnetic section and the hard magnetic section through the spin transfer intermediate section, and the magnetization direction of the soft magnetic section is switched by spin transfer due to spin-polarized electrons. For this purpose, the hard magnetic section HM1, the soft magnetic section SM1, the soft magnetic section SM2 and the hard magnetic section HM2 are connected to electrodes E1, E2, E3 and E4, respectively. It is possible by inputting input signals to the electrodes E1 and E2 to control the magnetization direction of the soft magnetic section SM1 of the first magnetoresistive element 110. Similarly, it is possible by inputting input signals to the electrodes E3 and E4 to control the magnetization direction of the soft magnetic section SM2 of the second magnetoresistive element 120. A logical value of the magnetic logic element 100 is determined depending on a relationship (parallel or anti-parallel) between the respective magnetization directions of the soft magnetic section SM1 and the soft magnetic section SM2.

Regarding the magnetic logic element 100, two input signals (A, B) are appropriately input to the electrodes E1 to E4. As a result, the magnetic logic element 100 can achieve logic functions such as EXOR, EXNOR, AND, NAND, OR and NOR. In other words, it is possible to reconfigure the logic function. This kind of element is referred to as a "reconfigurable logic gate".

CITATION LIST

Patent Literature

[PTL1] Japanese Patent Publication JP-2004-6775
[PTL2] Japanese Patent Publication JP-2005-235307
[PTL3] Japanese Patent Publication JP-2006-24714
[PTL4] Japanese Patent Publication JP-2008-99284
[PTL5] Japanese Patent Publication JP-2006-526907

SUMMARY OF INVENTION

According to the configuration shown in FIG. 1, four layers of magnetic sections (HM1, SM1, SM2, HM2) are required for achieving the two-input reconfigurable logic gate. The reason is that the hard magnetic sections (HM1, HM2) are disposed separately in the layer thickness direction. An object of the present invention is to provide a technique that can achieve a reconfigurable logic gate at a lower cost.

In a first aspect of the present invention, a logic gate is provided. The logic gate has a magnetoresistive element, a magnetization state control unit and an output unit. The magnetoresistive element has a laminated structure comprising N (N is an integer not smaller than 3) magnetic layers and N−1 nonmagnetic layers that are alternately laminated. A resistance value of the magnetoresistive element varies depending on magnetization states of the N magnetic layers. The magnetization state control unit sets the respective magnetization states of the N magnetic layers depending on N input data. The output unit outputs an output data that varies depending on the resistance value of the magnetoresistive element.

In a second aspect of the present invention, a semiconductor integrated circuit having the above-described logic gate is provided.

In a third aspect of the present invention, a method of operating a logic gate having a magnetoresistive element is provided. The magnetoresistive element has a laminated structure comprising N (N is an integer not smaller than 3) magnetic layers and N−1 nonmagnetic layers that are alternately laminated. Respective magnetization states of the N magnetic layers depend on N input data that are input to the logic gate. A resistance value of the magnetoresistive element varies depending on the respective magnetization states of the N magnetic layers. An output data of the logic gate varies depending on the resistance value of the magnetoresistive element. The method of operating the logic gate includes: (A) a step of inputting a part of the N input data to set a magnetization state of a magnetic layer associated with the part of the N input data among the N magnetic layers; and (B) a step of inputting remainder of the N input data to output the output data.

In a fourth aspect of the present invention, a magnetoresistive element is provided. The magnetoresistive element has N (N is an integer not smaller than 3) magnetic layers and N−1 nonmagnetic layers. The N magnetic layers and the N−1 nonmagnetic layers are alternately laminated. Each of the N magnetic layers has: a first magnetization fixed region whose magnetization direction is fixed in a first direction; a second magnetization fixed region whose magnetization direction is fixed in a second direction opposite to the first direction; and a magnetization switching region provided between the first magnetization fixed region and the second magnetization fixed region. A magnetization direction of the magnetization switching region is switched between the first direction and the second direction, by domain wall motion driven by a current flowing between the first magnetization fixed region and the second magnetization fixed region.

According to the present invention, it is possible to achieve a reconfigurable logic gate at a lower cost.

BRIEF DESCRIPTION OF DRAWINGS

The above and other objects, advantages and features of the present invention will be more apparent from the following description of certain exemplary embodiments taken in conjunction with the accompanying drawings.

FIG. 9 shows a correspondence relationship between input data and output data in the case of FIG. 8.

FIG. 11 shows a correspondence relationship between input data and output data in the case of FIG. 10.

FIG. 13 is a summary diagram showing logic operations by the logic gate according to the present exemplary embodiment.

DESCRIPTION OF EMBODIMENTS

Exemplary embodiments of the present invention will be described with reference to the attached drawings.

1. Magnetoresistive Element

Figure 2:
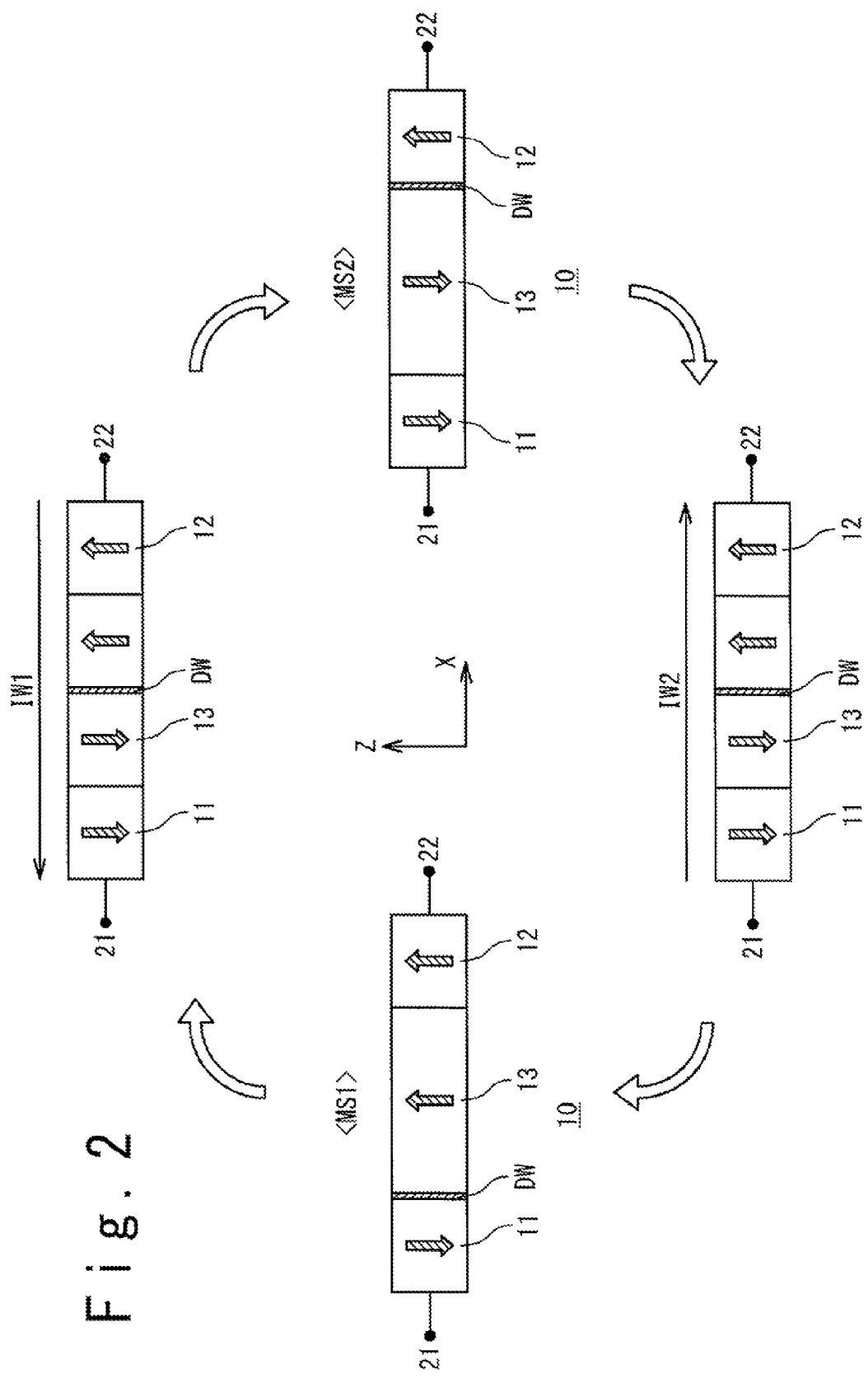
FIG. 2 is a schematic view showing a magnetic layer used in a magnetoresistive element according to an exemplary embodiment of the present invention.

FIG. 2 shows a magnetic layer 10 used in a magnetoresistive element according to the present exemplary embodiment. In the present exemplary embodiment, a magnetization state of the magnetic layer 10 is not fixed, and a magnetization direction of at least a part of the magnetic layer 10 is variable. For example, the magnetic layer 10 has a similar configuration to a magnetization recording layer (domain wall motion layer) used in a typical domain wall motion MRAM. The magnetic layer 10 has a domain wall DW, and it is possible by supplying a current in an in-plane direction in the magnetic layer 10 to move the domain wall DW to change the magnetization state.

More specifically, as shown in FIG. 2, the magnetic layer 10 has a first magnetization fixed region 11, a second magnetization fixed region 12 and a magnetization switching region 13. The magnetization switching region 13 is sandwiched between the first magnetization fixed region 11 and the second magnetization fixed region 12. In other words, the first magnetization fixed region 11 and the second magnetization fixed region 12 are provided on both sides of the magnetization switching region 13. A magnetization direction of the first magnetization fixed region 11 is substantially fixed in a first direction. A magnetization direction of the second magnetization fixed region 12 is substantially fixed in a second direction. The first direction and the second direction are opposite to each other. A magnetization direction of the magnetization switching region 13 is not fixed and is reversible between the first direction and the second direction.

The magnetic layer 10 is formed of, for example, a perpendicular magnetic film having perpendicular magnetic anisotropy. In this case, the magnetization direction of each region of the magnetic layer 10 is either the +Z-direction or the −Z-direction that is perpendicular to a film surface. Alternatively, the magnetic layer 10 may be formed of an in-plane magnetic film having in-plane magnetic anisotropy. In this case, the magnetization direction of each region of the magnetic layer 10 is an in-plane direction perpendicular to the Z-direction. In either case, a single magnetic layer 10 is made of the same magnetic material.

In the example shown in FIG. 2, the magnetic layer 10 has the perpendicular magnetic anisotropy. In FIG. 2, the magnetization direction of the first magnetization fixed region 11 is fixed in the −Z-direction, and the magnetization direction of the second magnetization fixed region 12 is fixed in the opposite +Z-direction. The magnetization direction of the magnetization switching region 13 is allowed to be either the −Z-direction or the +Z-direction. In a case where the magnetization direction of the magnetization switching region 13 is the +Z-direction, the domain wall DW is formed in the vicinity of a boundary between the first magnetization fixed region 11 and the magnetization switching region 13. The magnetization state in this case is hereinafter referred to as a "first magnetization state MS1". On the other hand, in a case where the magnetization direction of the magnetization switching region 13 is the −Z-direction, the domain wall DW is formed in the vicinity of a boundary between the second magnetization fixed region 12 and the magnetization switching region 13. The magnetization state in this case is hereinafter referred to as a "second magnetization state MS2".

The magnetization state of the magnetic layer 10, namely, the magnetization direction of the magnetization switching region 13 can be changed by supplying a current in an in-plane direction. For this purpose, a first current supply terminal 21 and a second current supply terminal 22 are provided. The first current supply terminal 21 and the second current supply terminal 22 are connected to the first magnetization fixed region 11 and the second magnetization fixed region 12, respectively.

As shown in FIG. 2, a first write current IW1 is supplied from the second current supply terminal 22 to the first current supply terminal 21 in order to change the magnetization state from MS1 to MS2. In this case, spin-polarized electrons of the −Z-direction are supplied from the first magnetization fixed region 11 to the magnetization switching region 13. Due to the spin transfer, the domain wall DW is driven and moves from the side of the first magnetization fixed region 11 toward the side of the second magnetization fixed region 12. As a result, the magnetization direction of the magnetization switching region 13 is reversed to be the −Z-direction and thus the second magnetization state MS2 is obtained.

On the other hand, a second write current IW2 is supplied from the first current supply terminal 21 to the second current supply terminal 22 in order to change the magnetization state from MS2 to MS1. In this case, spin-polarized electrons of the +Z-direction are supplied from the second magnetization fixed region 12 to the magnetization switching region 13. Due to the spin transfer, the domain wall DW is driven and moves from the side of the second magnetization fixed region 12 toward the side of the first magnetization fixed region 11. As a result, the magnetization direction of the magnetization switching region 13 is reversed to be the +Z-direction and thus the first magnetization state MS1 is obtained.

In this manner, according to the present exemplary embodiment, the current is supplied to the magnetic layer 10 through the first current supply terminal 21 and the second current supply terminal 22. Then, the domain wall DW moves due to the current flowing between the first magnetization fixed region 11 and the second magnetization fixed region 12. Due to the current driven domain wall motion, the magnetization direction of the magnetization switching region 13 is switched, namely the magnetization state of the magnetic layer 10 is changed. Whether the first magnetization state MS1 is obtained or the second magnetization state MS2 is obtained depends on the direction of the current. In other words, it is possible by controlling the direction of the current to set the magnetization state of the magnetic layer 10.

It should be noted that the magnetic layer 10 is preferably a perpendicular magnetic film having the perpendicular magnetic anisotropy, as in the present exemplary embodiment. In the case of the perpendicular magnetic film, a current required for the domain wall motion can be set smaller as the magnetic layer is made smaller and thinner, and thus a size of the element can be easily reduced. That is, it is possible to reduce a size of a logic gate using a magnetoresistive element according to the present exemplary embodiment (described later).

According to the present exemplary embodiment, a magnetoresistive element 1 is formed by using the above-described magnetic layer 10. More specifically, the magnetoresistive element 1 has a laminated structure having N magnetic layers 10 and N−1 nonmagnetic layers that are alternately laminated. Here, N is an integer not smaller than 3. That is, in the present exemplary embodiment, three or more magnetic layers 10 are laminated via the nonmagnetic layer, and thereby the magnetoresistive element 1 is formed.

Figure 3:
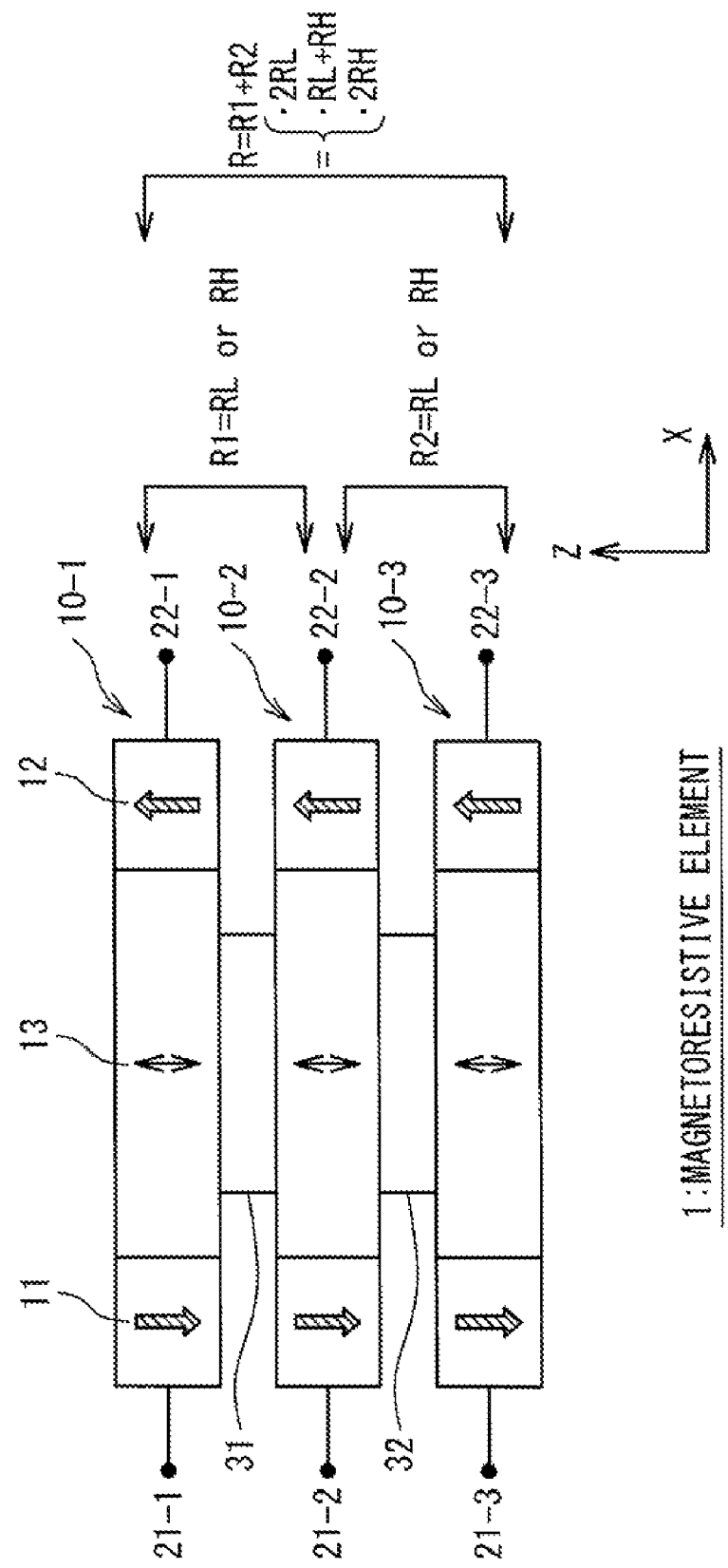
FIG. 3 is a schematic view showing a configuration of the magnetoresistive element according to the present exemplary embodiment.

FIG. 3 shows an example of the magnetoresistive element 1 according to the present exemplary embodiment. In the example shown in FIG. 3, three magnetic layers 10-1, 10-2 and 10-3 and two nonmagnetic layers 31 and 32 are alternately laminated. More specifically, the first magnetic layer 10-1 and the second magnetic layer 10-2 are laminated via the first nonmagnetic layer 31. The first nonmagnetic layer 31 is at least sandwiched between the magnetization switching region 13 of the first magnetic layer 10-1 and the magnetization switching region 13 of the second magnetic layer 10-2. Also, the second magnetic layer 10-2 and the third magnetic layer 10-3 are laminated via the second nonmagnetic layer 32. The second nonmagnetic layer 32 is at least sandwiched between the magnetization switching region 13 of the second magnetic layer 10-2 and the magnetization switching region 13 of the third magnetic layer 10-3. Each nonmagnetic layer is, for example, a thin insulating film (tunnel barrier layer) such as an $Al_2O_3$ film and an MgO film.

The first nonmagnetic layer 31 and the magnetic layers 10-1 and 10-2 on both sides thereof form one MTJ (first MTJ). A resistance value R1 of the MTJ depends on the respective magnetization states of the first magnetic layer 10-1 and the second magnetic layer 10-2. For example, in a case where the first magnetic layer 10-1 and the second magnetic layer 10-2 both have the same magnetization state, namely, in a case where the magnetization directions of the respective magnetization switching regions 13 are "parallel" to each other, the resistance value R1 takes a relatively low value RL. On the other hand, in a case where the first magnetic layer 10-1 and the second magnetic layer 10-2 have different magnetization states, namely, in a case where the magnetization directions of the respective magnetization switching regions 13 are "anti-parallel" to each other, the resistance value R1 takes a relatively high value RH. The resistance value RH is higher than the resistance value RL (RH>RL). Similarly, the second nonmagnetic layer 32 and the magnetic layers 10-2 and 10-3 on both sides thereof form one MTJ (second MTJ). A resistance value R2 of the MTJ depends on the respective magnetization states of the second magnetic layer 10-2 and the third magnetic layer 10-3, and takes either a relatively low value RL or a relatively high value RH.

It is preferable that the resistance values RH and RL of the first MTJ are respectively equal to the resistance values RH and RL of the second MTJ. That is, it is preferable that the magnetoresistive element 1 is designed such that the first MTJ and the second MTJ have the same magnetic characteristics. For example, the magnetic layers 10-1, 10-2 and 10-3 are so formed of the same material as to have the same film thickness. Also, the nonmagnetic layers 31 and 32 are so formed of the same material as to have the same film thickness.

A resistance value R of the magnetoresistive element 1 as a whole, namely, a resistance value R in the lamination direction in FIG. 3 is a sum of the above-mentioned resistance value R1 and resistance value R2 (R=R1+R2). Depending on combinations of the resistance value R1 and the resistance value R2, the resistance value R can take three patterns 2RL, RL+RH and 2RH (2RL<RL+RH<2RH). The resistance value R of the magnetoresistive element 1 varies depending on the respective magnetization states of the magnetic layers 10-1 to 10-3.

As described above, the magnetization state of each magnetic layer 10 can be set by supplying the current through the first current supply terminal 21 and the second current supply terminal 22. As shown in FIG. 3, the current is supplied to the first magnetic layer 10-1 through current supply terminals 21-1 and 22-1. The current is supplied to the second magnetic layer 10-2 through current supply terminals 21-2 and 22-2. The current is supplied to the third magnetic layer 10-3 through current supply terminals 21-3 and 22-3.

Figure 4:
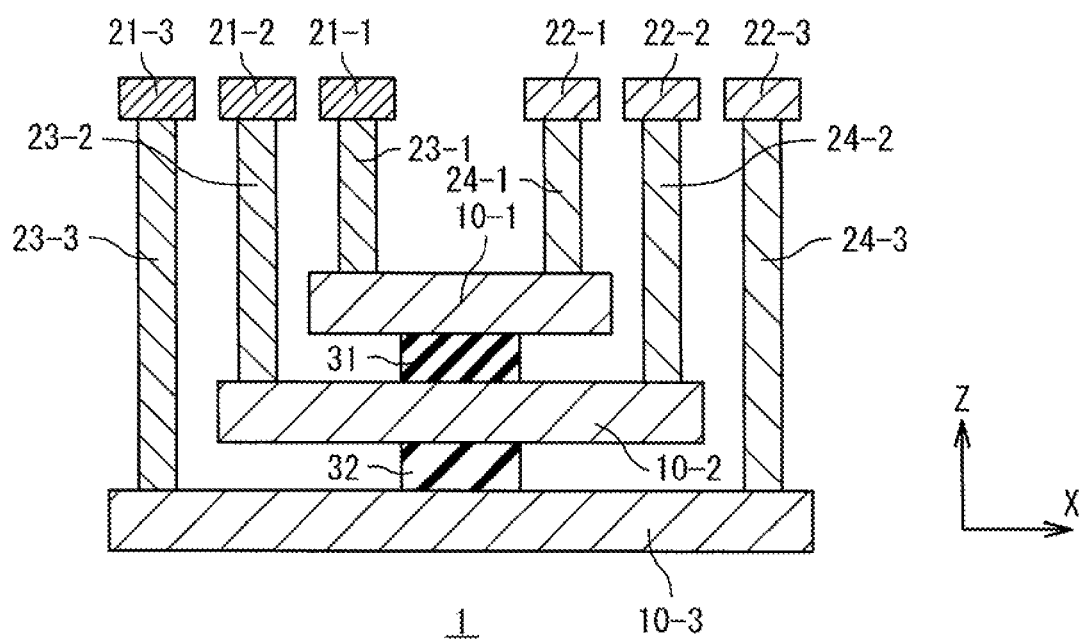
FIG. 4 is a cross-sectional view showing an example of a layout structure of the magnetoresistive element according to the present exemplary embodiment.

FIG. 4 is a cross-sectional view showing an example of a layout structure of the magnetoresistive element 1 according to the present exemplary embodiment. The current supply terminals 21 and 22 are formed in an upper interconnect layer as compared with the magnetoresistive element 1. The first magnetic layer 10-1 is connected to the respective current supply terminal 21-1 and 22-1 through contacts 23-1 and 24-1. The second magnetic layer 10-2 is connected to the respective current supply terminals 21-2 and 22-2 through contacts 23-2 and 24-2. The third magnetic layer 10-3 is connected to the respective current supply terminals 21-3 and 22-3 through contacts 23-3 and 24-3.

In the example shown in FIG. 4, each magnetic layer 10 is so formed as to extend in the same in-plane direction (the X-direction). Moreover, the length in the X-direction is different between the magnetic layers 10 such that the contacts connected to the respective magnetic layers 10 do not overlap with each other. More specifically, respective lengths of the magnetic layers 10 in the X-direction become larger from the upper layer towards the lower layer. That is to say, the second magnetic layer 10-2 is formed longer on both sides than the first magnetic layer 10-1, and the third magnetic layer 10-3 is formed longer on both sides than the second magnetic layer 10-2.

Figure 5:
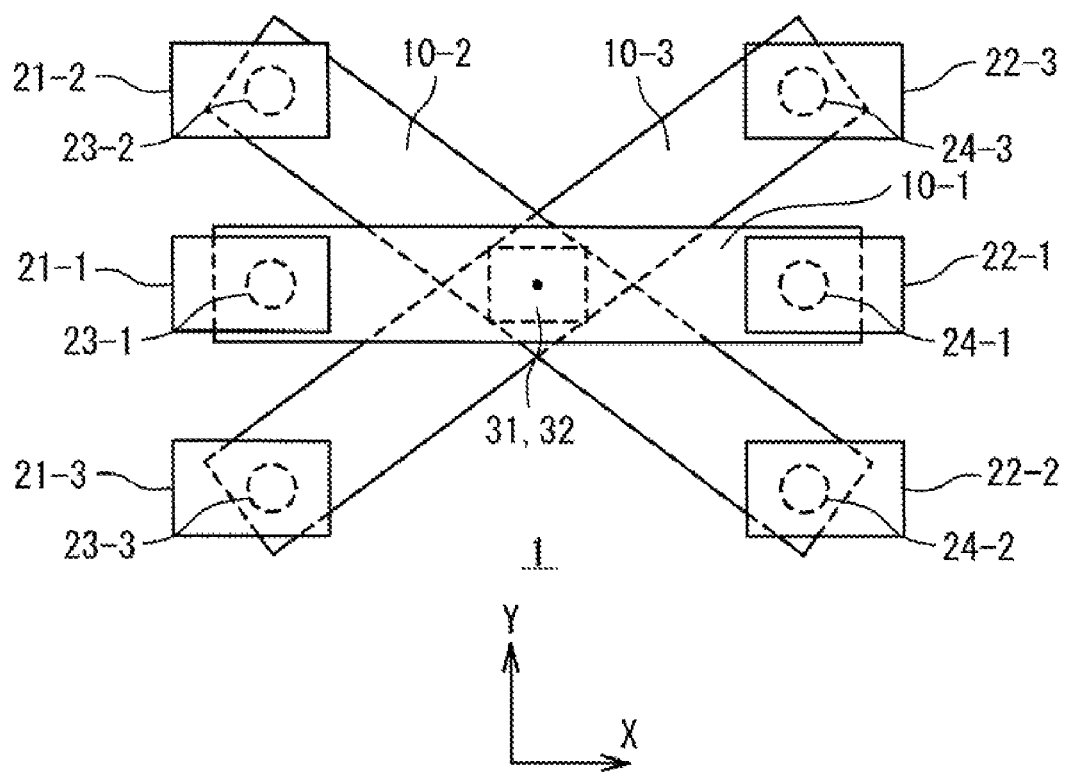
FIG. 5 is a top view showing another example of a layout structure of the magnetoresistive element according to the present exemplary embodiment.

FIG. 5 is a top view showing another example of a layout structure of the magnetoresistive element 1. In this example, the magnetic layers 10-1 to 10-3 are so formed as to extend in respectively different in-plane directions. As a result, the contacts connected to the respective magnetic layers 10 are prevented from overlapping with each other. Note that the magnetic layers 10-1 to 10-3 overlap with each other at least at a position of the nonmagnetic layers 31 and 32.

It should be noted that a planar shape of each magnetic layer 10 is not limited to rectangle. For example, the planar shape of each magnetic layer 10 can be rhombus, U-shape and the like. The planar shape of the magnetic layer 10 is arbitrary as long as the domain wall motion can be achieved.

2. Logic Gate

Figure 6:
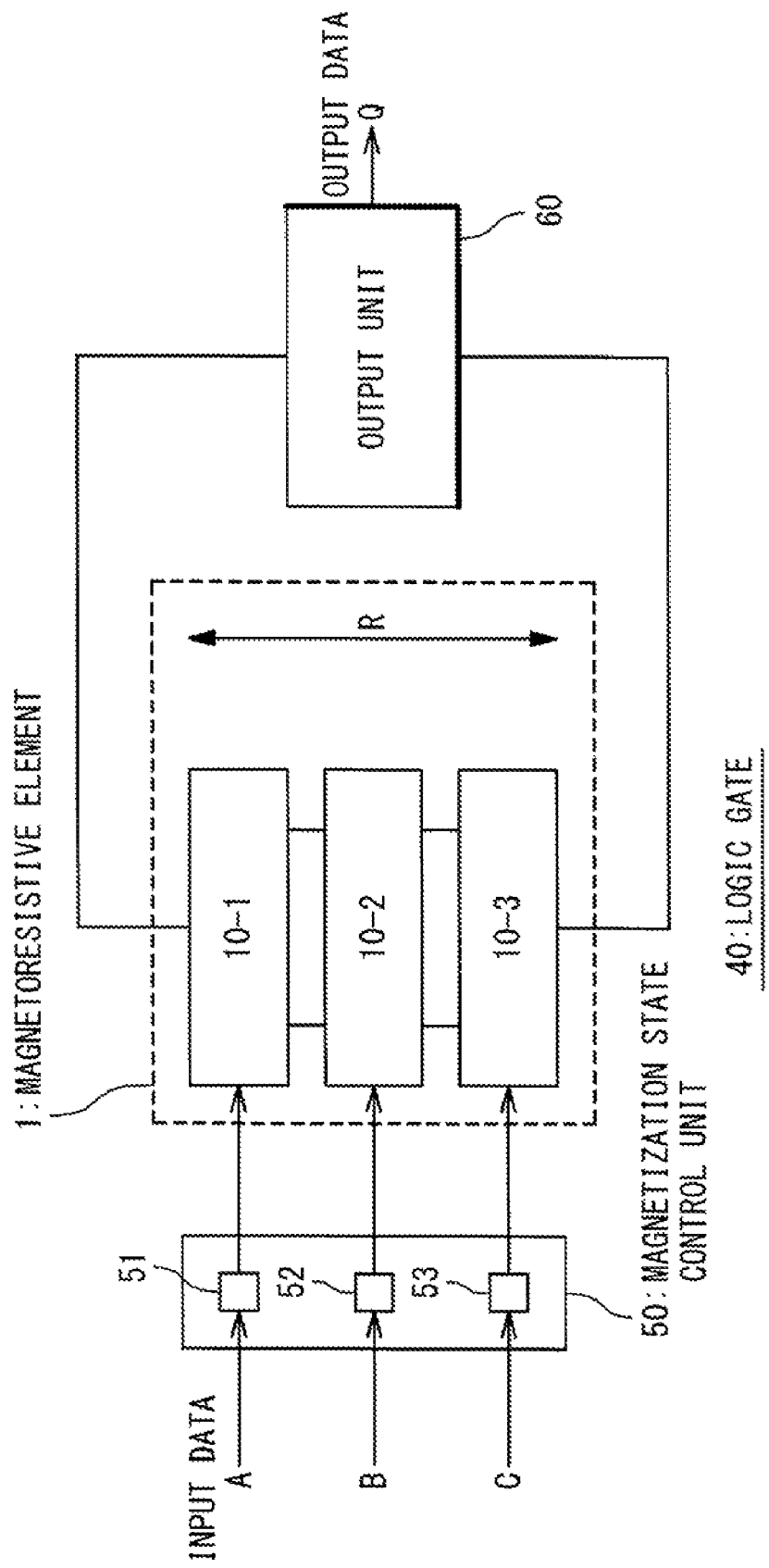
FIG. 6 is a block diagram showing a configuration of a logic gate according to the present exemplary embodiment.

According to the present exemplary embodiment, a reconfigurable logic gate 40 can be achieved by utilizing the above-described magnetoresistive element 1. FIG. 6 is a block diagram showing a configuration of the logic gate 40 according to the present exemplary embodiment. As shown in FIG. 6, the logic gate 40 has the magnetoresistive element 1, a magnetization state control unit 50 and an output unit 60. Input to the logic gate 40 are N input data. In a case where N=3, three kinds of input data (A, B, C) are input. The logic gate 40 performs a logic operation based on the input data and outputs the result as an output data Q.

More specifically, the input data A, B and C are input to the magnetization state control unit 50. The magnetization state control unit 50 sets the magnetization states of the respective magnetic layers 10-1, 10-2 and 10-3 of the magnetoresistive element 1, depending on the respective input data A, B and C. That is, the magnetization state control unit 50 sets the first magnetic layer 10-1 to a magnetization state depending on the input data A. For example, in a case where the input data A is "1", the magnetization state control unit 50 sets the first magnetic layer 10-1 to the first magnetization state MS1 (refer to FIG. 2). On the other hand, in a case where the input data A is "0", the magnetization state control unit 50 sets the first magnetic layer 10-1 to the second magnetization state MS2. The same applies to a relationship between the input data B and the magnetization state of the second magnetic layer 10-2 and a relationship between the input data C and the magnetization state of the third magnetic layer 10-3.

For setting the magnetization state of each magnetic layer 10, the magnetization state control unit 50 includes current supply circuits 51, 52 and 53.

The current supply circuit 51 is connected to the current supply terminals 21-1 and 22-1 that are related to the first magnetic layer 10-1. The current supply circuit 51 supplies the write current (IW1 or IW2) to the first magnetic layer 10-1 through the current supply terminals 21-1 and 22-1. The direction of the write current is switched depending on the input data A. For example, in the case where the input data A is "1", the current supply circuit 51 supplies the second write current IW2 to the first magnetic layer 10-1. As a result, the first magnetic layer 10-1 is set to the first magnetization state MS1 (refer to FIG. 2). On the other hand, in the case where the input data A is "0", the current supply circuit 51 supplies the first write current IW1 to the first magnetic layer 10-1. As a result, the first, magnetic layer 10-1 is set to the second magnetization state MS2. In this manner, the current supply circuit 51 supplies the write current whose direction is switched depending on the input data A to the first magnetic layer 10-1.

The same applies to the current supply circuits 52 and 53. The current supply circuit 52 is connected to the current supply terminals 21-2 and 22-2 that are related to the second magnetic layer 10-2, and supplies the write current (IW1 or IW2) depending on the input data B to the second magnetic layer 10-2. The current supply circuit 53 is connected to the current supply terminals 21-3 and 22-3 that are related to the third magnetic layer 10-3, and supplies the write current (IW1 or IW2) depending on the input data C to the third magnetic layer 10-3. It should be noted that the write current is supplied for a predetermined period of time.

As described above, the magnetization state control unit 50 supplies the currents depending on the input data A, B and C and thereby sets the magnetization states of the respective magnetic layers 10-1, 10-2 and 10-3. Consequently, the magnetization states of the respective magnetic layers 10-1, 10-2 and 10-3 of the magnetoresistive element 1 depend on the input data A, B and C input to the logic gate 40. The resistance value R of the magnetoresistive element 1 varies depending on the magnetization states of the magnetic layers 10-1, 10-2 and 10-3 (refer to FIG. 3). Therefore, it can be said that the resistance value R of the magnetoresistive element 1 also varies depending on the input data A, B and C.

The output unit 60 is connected to the magnetoresistive element 1. The output unit 60 generates and outputs the output data Q that depends on the resistance value R of the magnetoresistive element 1. That is, the output data Q of the logic gate 40 varies depending on the resistance value R of the magnetoresistive element 1. As described above, the resistance value R of the magnetoresistive element 1 can take the three patterns 2RL, RL+RH and 2RH (2RL<RL+RH<2RH) depending on combinations of the magnetization states of the respective magnetic layers 10-1 to 10-3. Based on the resistance value R, the output unit 60 outputs either a data "0" or a data "1" as the output data Q.

More specifically, the output unit 60 outputs one of the data "0" and the data "1" if the resistance value R is higher than a predetermined threshold value Rth, and outputs the other of the data "0" and the data "1" if the resistance value R is lower than the threshold value Rth. For example, the threshold value Rth is set to a value between "2RL" and "RL+RH". In a case where the resistance value R is "2RL" that is lower than the threshold value Rth, the data "0" is output as the output data Q, for example. On the other hand, in a case where the resistance value R is "RL+RH" or "2RH" that is higher than the threshold value Rth, the data "1" is output as the output data Q.

Figure 7:
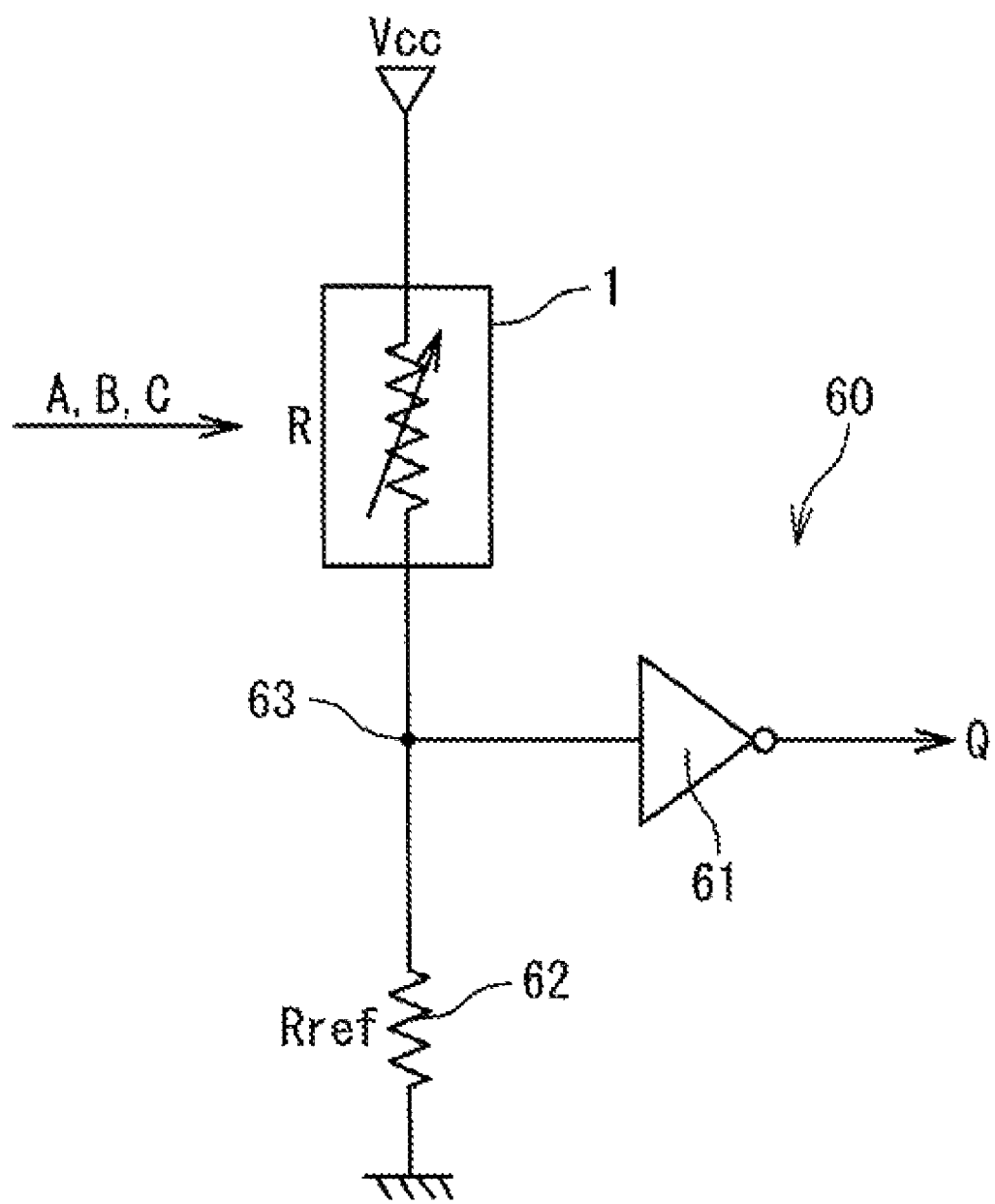
FIG. 7 shows an example of an output unit of the logic gate according to the present exemplary embodiment.

FIG. 7 shows an example of a circuit configuration for achieving the output unit 60. In FIG. 7, the output unit 60 has an inverter 61 and a resistor 62 (resistance value: Rref). The resistor 62 is connected between a node 63 and a ground terminal. The magnetoresistive element 1 is connected between the node 63 and a power supply terminal (power supply voltage: Vcc). That is, the magnetoresistive element 1 and the resistor 62 are connected in series between the power supply terminal and the ground terminal. The resistance value R of the magnetoresistive element 1 varies depending on the input data A, B and C. On the other hand, the resistance value Rref of the resistor 62 is beforehand designed to be an appropriate value. In this case, a voltage of the node 63 is given by Vcc×Rref/(R+Rref).

An input terminal of the inverter 61 is connected to the node 63, and the output data Q is output from an output terminal of the inverter 61. The above-mentioned voltage of the node 63 is applied to gates of a PMOS transistor and an NMOS transistor of the inverter 61. The resistance value Rref of the resistor 62 is designed such that the inverter 61 operates as follows. That is, in the case where the resistance value R is "2RL" that is lower than the threshold value Rth, the NMOS transistor is turned ON and the inverter 61 outputs the ground voltage (Q=0). On the other hand, in the case where the resistance value R is "RL+RH" or "2RH" that is higher than the threshold value Rth, the PMOS transistor is turned ON and the inverter 61 outputs the power supply voltage (Q=1). In this manner, the output unit 60 according to the present exemplary embodiment can be achieved.

3. Method for Using the Logic Gate

According to the present exemplary embodiment, a logic function of the logic gate 40 is reconfigurable.

Figure 8:
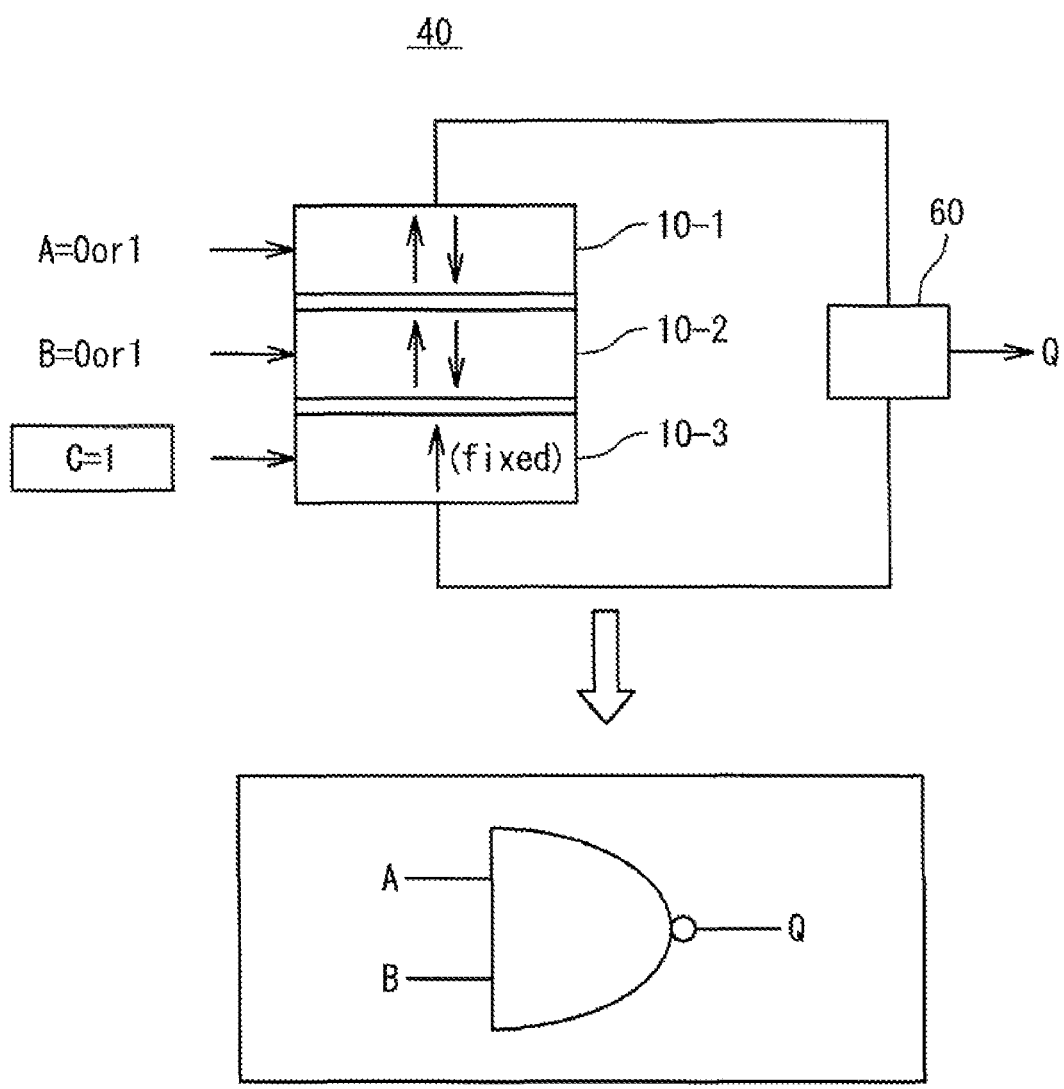
FIG. 8 shows an example of a logic function achieved by the logic gate according to the present exemplary embodiment.

FIG. 8 shows an example of the logic function achieved by the logic gate 40. In the present example, the input data C is fixed to "1" (C=1), and the third magnetic layer 10-3 is fixed to the first magnetization state MS1. In this case, the output data Q varies depending on the input data A and B. FIG. 9 shows a correspondence relationship between the input data A and B and the output data Q in the case of FIG. 8. Four patterns P1 to P4 can be obtained depending on combinations of the input data A and B. As can be clearly seen from FIG. 9, the logic gate 40 in the present example functions as a "two-input NAND gate".

Figure 10:
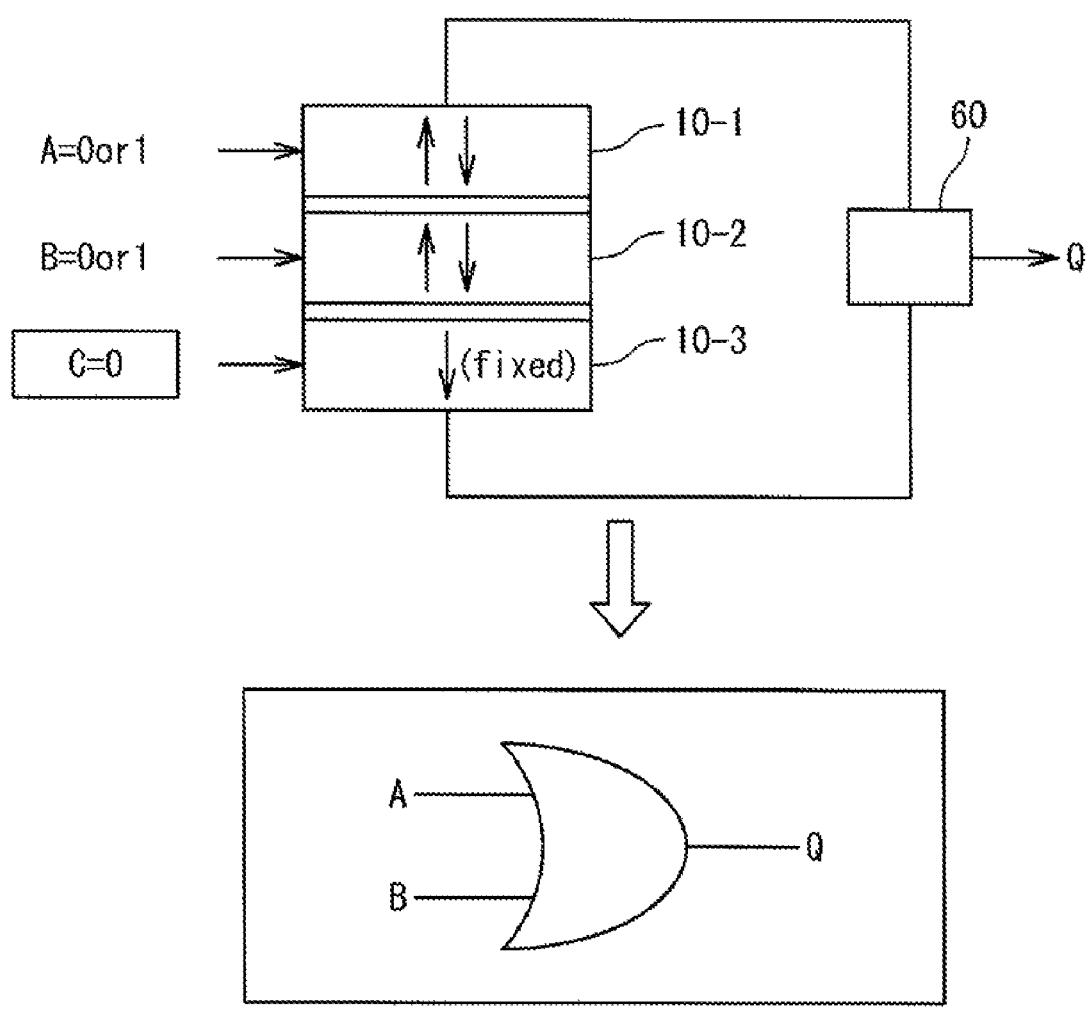
FIG. 10 shows another example of a logic function achieved by the logic gate according to the present exemplary embodiment.

FIG. 10 shows another example of the logic function achieved by the logic gate 40. In the present example, the input data C is fixed to "0" (C=0), and the third magnetic layer 10-3 is fixed to the second magnetization state MS2. In this case, the output data Q varies depending on the input data A and B. FIG. 11 shows a correspondence relationship between the input data A and B and the output data Q in the case of FIG. 10. Four patterns P5 to P8 can be obtained depending on combinations of the input data A and B. As can be clearly seen from FIG. 11, the logic gate 40 in the present example functions as a "two-input OR gate".

Figure 12:
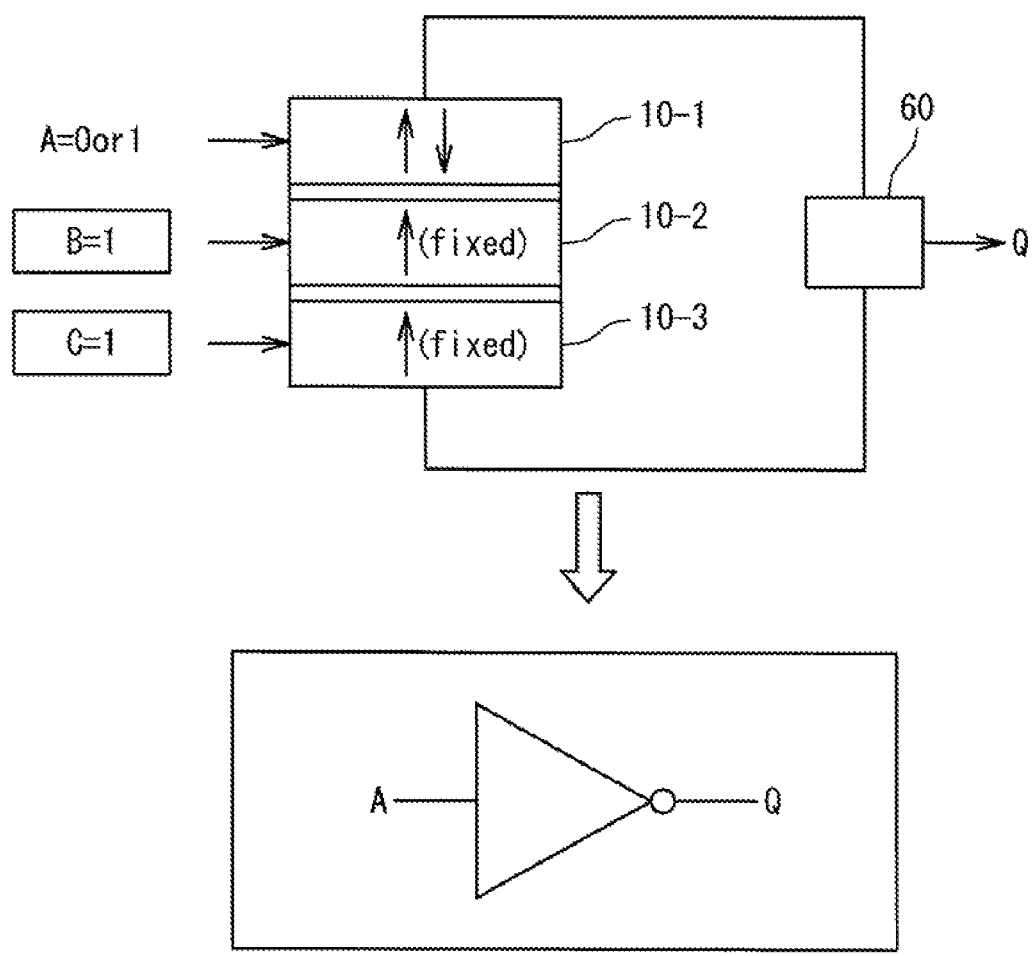
FIG. 12 shows still another example of a logic function achieved by the logic gate according to the present exemplary embodiment.

FIG. 12 shows still another example of the logic function achieved by the logic gate 40. In the present example, the input data B and C are fixed to "1" (B=1, C=1), and the second magnetic layer 10-2 and the third magnetic layer 10-3 both are fixed to the first magnetization state MS1. In this case, the output data Q varies depending on the input data A. A correspondence relationship between the input data A and the output data Q in this case is the same as the patterns P1 and P2 shown in FIG. 9. That is, the logic gate 40 in the present example functions as a "NOT gate" that outputs an inverted data of the input data A.

Figure 14:
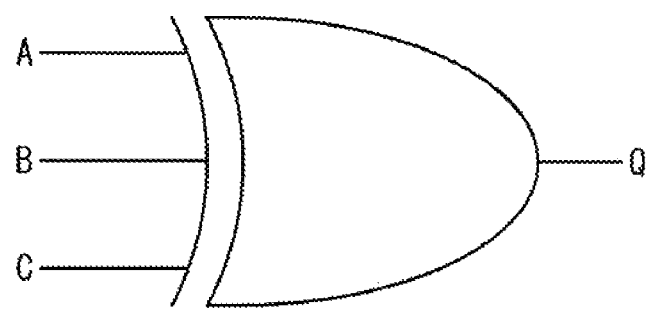
FIG. 14 shows still another example of a logic function achieved by the logic gate according to the present exemplary embodiment.

Eight patterns obtained by combinations of the three kinds of input data A, B and C are the patterns P1 to P4 shown in FIG. 9 and the patterns P5 to P8 shown in FIG. 11. FIG. 13 summarizes the eight patterns P1 to P8. As can be clearly seen from FIG. 13, the logic gate 40 functions as a "three-input EXOR gate" when no input data is fixed. FIG. 14 represents the logic gate 40 in that case.

Figure 15:
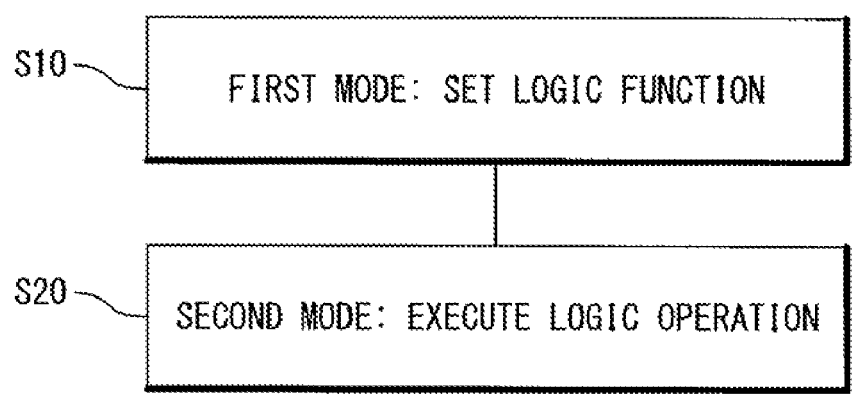
FIG. 15 is a flow chart showing a method for using the logic gate according to the present exemplary embodiment.

In this manner, the logic gate 40 according to the present exemplary embodiment can achieve the four kinds of logic functions. That is, the logic function of the logic gate 40 is reconfigurable in accordance with the intended use. FIG. 15 is a flow chart showing a method for using the logic gate 40.

Step S10:

In a first mode, the logic function of the logic gate 40 is set to a desired one of the above-described four kinds. At this time, the logic function of the logic gate 40 can be changed by inputting at least one of the input data A, B and C. For example, the logic gate 40 can be set to the two-input NAND gate by inputting the input data C=1 so as to previously set the magnetization state of the corresponding third magnetic layer 10-3. Also, the logic gate 40 can be set to the two-input OR gate by inputting the input data C=0 so as to previously set the magnetization state of the corresponding third magnetic layer 10-3. Also, the logic gate 40 can be set to the NOT gate by inputting the input data B=1, C=1 so as to previously set the magnetization states of the corresponding second magnetic layer 10-2 and third magnetic layer 10-3. When setting the logic gate 40 to the three-input EXOR gate, there is no need to input the input data. In this manner, it is possible to reconfigure the logic function of the logic gate 40 prior to execution of the logic operation.

Step S20:

In a second mode, the logic gate 40 executes the logic operation to output the output data Q. At this time, remainder of the input data that is not used in the first mode for setting the logic function is input to the logic gate 40. For example, in the case of the NAND gate or the OR gate, the input data A and B are input. In the case of the NOT gate, the input data A is input. In the case of the EXOR gate, the input data A, B and C are input. As a result, the output data Q in accordance with the logic function set in the first mode is output.

According to the present exemplary embodiment, as described above, it is possible to achieve the four kinds of logic functions without changing the structure of the logic gate 40. That is to say, it is possible to reconfigure the logic function of the logic gate 40 in accordance with the intended use.

Moreover, according to the present exemplary embodiment, the logic gate 40 can achieve the three-input EXOR gate. That is, it is possible to achieve an advanced logic function by using a single logic gate 40. Therefore, area efficiency and integration can be improved. Moreover, the three-input EXOR gate can be achieved with the three magnetic layers 10-1 to 10-3. Therefore, production costs can be reduced.

Figure 1:
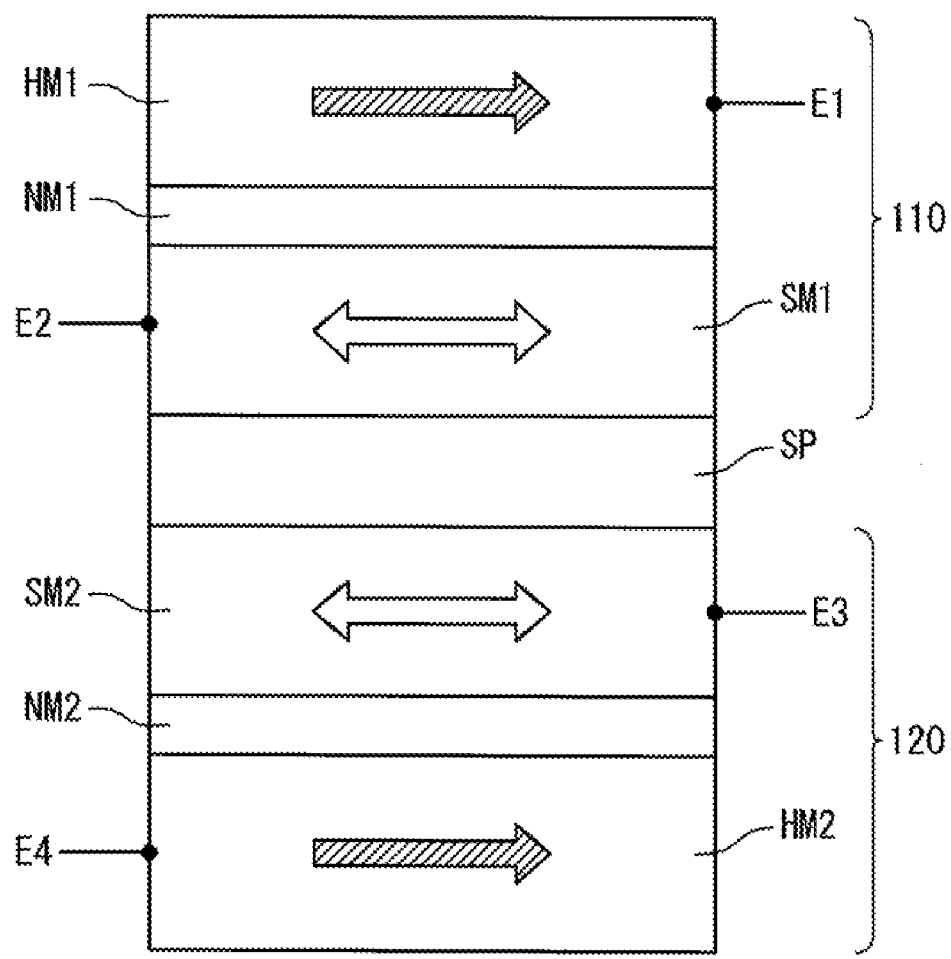
FIG. 1 is a schematic view showing a configuration of a magnetic logic element according to a related technique.

Furthermore, according to the present exemplary embodiment, the two-input logic gate can be achieved with the three magnetic layers 10-1 to 10-3. However, in the case of the configuration shown in FIG. 1, at least four magnetic layers are required for achieving a two-input logic gate.

According to the present exemplary embodiment, a total number of the magnetic layers can be reduced and thus the production costs can be reduced.

4. Modification Example

The configuration of the magnetoresistive element 1 according to the present exemplary embodiment is not limited to the one described above. The magnetoresistive element 1 may have four or more magnetic layers 10.

Figure 16:
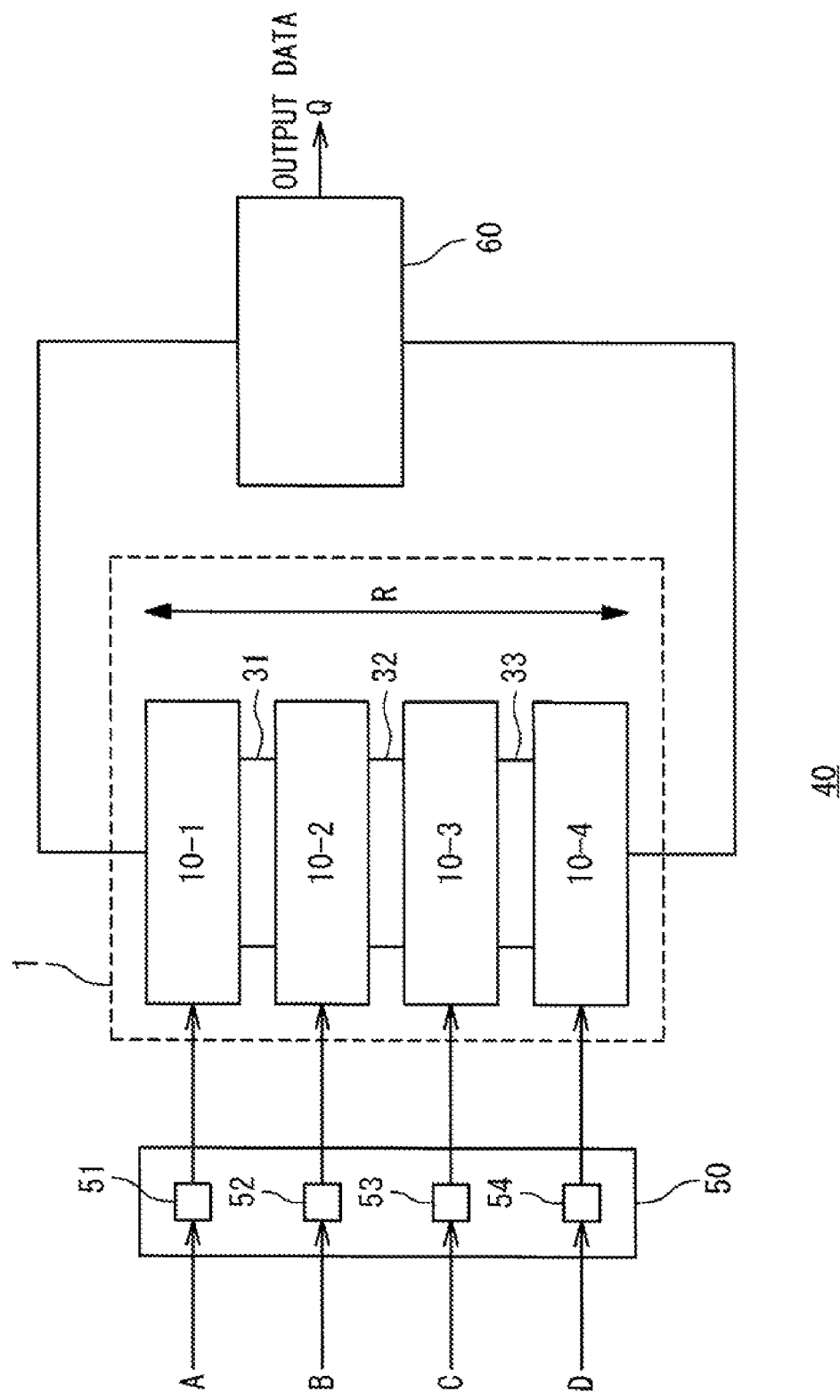
FIG. 16 is a block diagram showing a modification example of the magnetoresistive element and the logic gate according to the present exemplary embodiment.

FIG. 16 shows a magnetoresistive element 1 provided with four magnetic layers 10-1 to 10-4 and a logic gate 40 using the magnetoresistive element 1. The magnetoresistive element 1 has a fourth magnetic layer 10-4 and a third nonmagnetic layer 33 in addition to the components shown in FIG. 3. The third magnetic layer 10-3 and the fourth magnetic layer 10-4 are laminated via the third nonmagnetic layer 33. Moreover, the magnetization state control unit 50 includes a current supply circuit 54 in addition to the current supply circuits 51 to 53. The current supply circuit 54 supplies the write current (IW1 or IW2) depending on the input data D to the fourth magnetic layer 10-4 and thereby controls the magnetization state of the fourth magnetic layer 10-4. Four kinds of logic functions can be similarly achieved by this configuration.

According to the present modification example, a four-input EXOR gate can be achieved with the four magnetic layers 10-1 to 10-4. Therefore, the area efficiency and the integration are further improved. In this manner, according to the magnetoresistive element 1 of the present exemplary embodiment, it is possible to achieve a multi-input logic function just by laminating the magnetic layers in the layer thickness direction. It is therefore possible to easily improve the area efficiency and the integration.

5. Semiconductor Integrated Circuit

Figure 17:
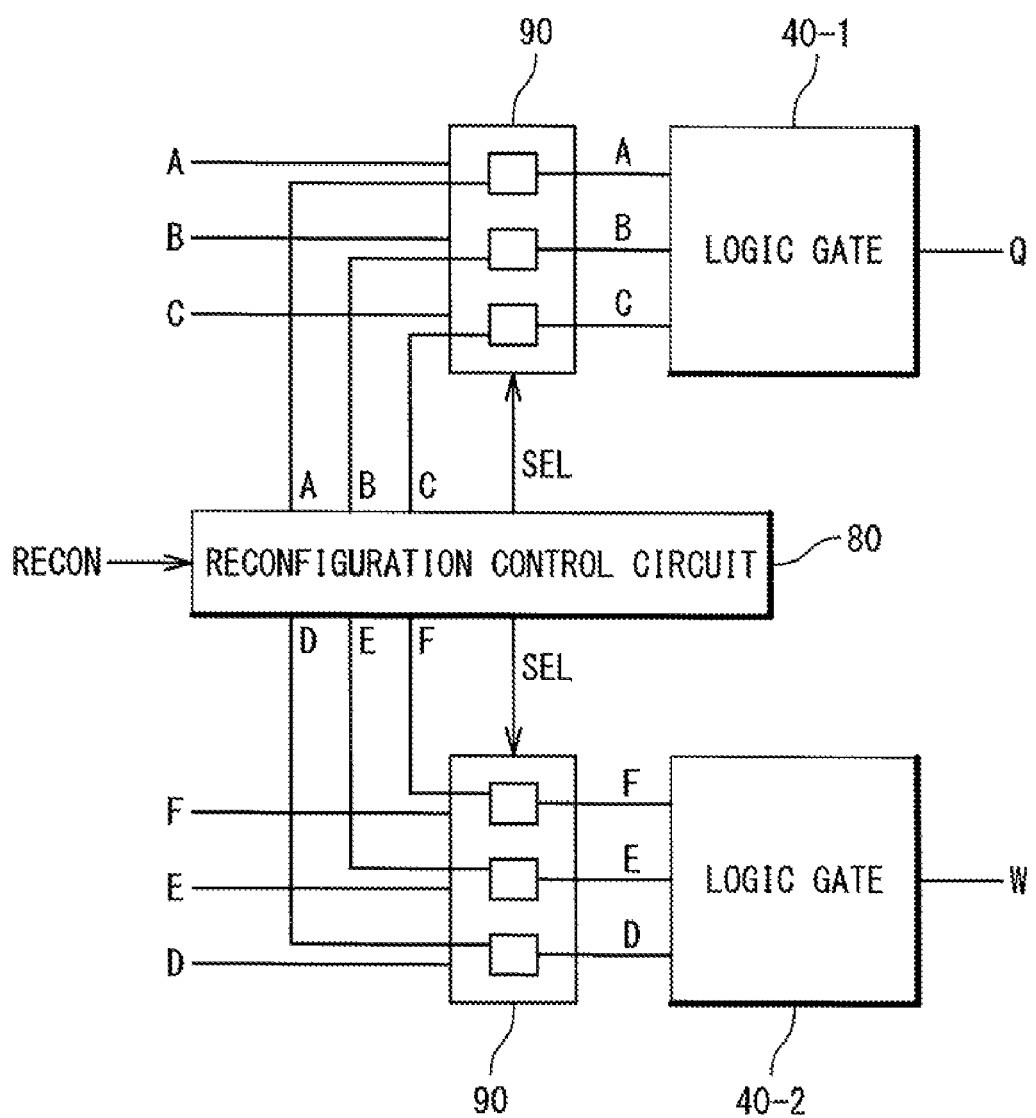
FIG. 17 is a block diagram showing an example of a configuration of a semiconductor integrated circuit provided with the logic gate according to the present exemplary embodiment.

By using the logic gate 40 according to the present exemplary embodiment, it is possible to create a semiconductor integrated circuit whose function is reconfigurable. FIG. 17 shows an example of a semiconductor integrated circuit 70 provided with the logic gate 40 according to the present exemplary embodiment. The semiconductor integrated circuit 70 has a plurality of logic gates 40. For example, a logic gate 40-1 executes a logic operation of the input data A, B and C to output an output data Q. Similarly, a logic gate 40-2 executes a logic operation of the input data D, E and F to output an output data W.

By appropriately setting the logic function of each logic gate 40, the function provided by the semiconductor integrated circuit 70 can be changed to a desired function. That is, it is possible to reconfigure the semiconductor integrated circuit 70. A circuit for that purpose is a reconfiguration control circuit 80. The reconfiguration control circuit 80 receives a reconfiguration signal RECON indicating a desired function. The reconfiguration signal RECON is issued by a CPU for example. In response to the reconfiguration signal RECON, the reconfiguration control circuit 80 executes the above-described Step S10. That is, the reconfiguration control circuit 80 changes the logic function of each logic gate 40 such that the function indicated by the reconfiguration signal RECON can be achieved.

Moreover, a selector 90 is disposed at the former stage of each logic gate 40. The selector 90 outputs, in accordance with a select signal SEL, either a normal input data or a reconfiguration input data output from the reconfiguration control circuit 80 to the logic gate 40. In the first mode (Step S10), the selector 90 outputs the reconfiguration input data output from the reconfiguration control circuit 80 to the logic gate 40. On the other hand, in the second mode (Step S20), the selector 90 outputs the normal input data to the logic gate 40.

By utilizing the logic gate 40 according to the present exemplary embodiment, integration of the reconfigurable semiconductor integrated circuit 70 is improved. Moreover, it is possible to achieve the reconfigurable semiconductor integrated circuit 70 at a low cost.

The exemplary embodiments of the present invention have been described above with reference to the attached drawings. However, the present invention is not limited to the above-described exemplary embodiments and can be appropriately modified by a person skilled in the art without departing from the scope of the invention.

This application is the National Phase of PCT/JP2009/064262, filed Aug. 12, 2009, which is based upon and claims the benefit of priority from Japanese patent application No. 2008-215184, filed on Aug. 25, 2008, the disclosure of which is incorporated herein in its entirely by reference.

The invention claimed is:

1. A logic gate comprising:
    a magnetoresistive element having a laminated structure comprising N (N is an integer not smaller than 3) magnetic layers and N−1 nonmagnetic layers that are alternately laminated, a resistance value of said magnetoresistive element varying depending on magnetization states of said N magnetic layers;
    a magnetization state control unit configured to set the respective magnetization states of said N magnetic layers depending on N input data; and
    an output unit configured to output output data that varies depending on said resistance value of said magnetoresistive element,
    wherein said magnetization state control unit supplies currents respectively to said N magnetic layers, directions of said currents being respectively switched depending on said N input data, and
    wherein the respective magnetization states of said N magnetic layers are changed by domain wall motion driven by said supplied currents.

2. The logic gate according to claim 1,
    wherein each of said N magnetic layers is formed of a perpendicular magnetic film having perpendicular magnetic anisotropy.

3. The logic gate according to claim 1,
    wherein each of said N magnetic layers comprises:
    a first magnetization fixed region whose magnetization direction is fixed in a first direction;
    a second magnetization fixed region whose magnetization direction is fixed in a second direction opposite to said first direction; and
    a magnetization switching region provided between said first magnetization fixed region and said second magnetization fixed region,
    wherein each of said currents flows between said first magnetization fixed region and said second magnetization fixed region, and a magnetization direction of said magnetization switching region is switched between said first direction and said second direction by said domain wall motion.

4. The logic gate according to claim 3,
wherein said first magnetization fixed region and said second magnetization fixed region of said each magnetic layer are respectively connected to a first current supply terminal and a second current supply terminal through contacts,
wherein said magnetization state control unit supplies the current to said each magnetic layer through said first current supply terminal and said second current supply terminal.

5. The logic gate according to claim 4,
wherein said N magnetic layers are so formed as to extend in a same in-plane direction, and
respective lengths of said N magnetic layers in said same in-plane direction become larger from an upper layer towards a lower layer.

6. The logic gate according to claim 4,
wherein said N magnetic layers are so formed as to extend in respectively different in-plane directions.

7. The logic gate according to claim 1,
wherein said output unit outputs one of a data 0 and a data 1 as said output data if said resistance value is higher than a threshold value, and outputs the other of the data 0 and the data 1 as said output data if said resistance value is lower than said threshold value.

8. The logic gate according to claim 1,
wherein at least one of said N input data is fixed.

9. The logic gate according to claim 1,
wherein a part of said N input data is input to said magnetization state control unit, and then remainder of said N input data is input to said magnetization state control unit.

10. A semiconductor integrated circuit comprising the logic gate according to claim 1.

11. A method of operating a logic gate having a magnetoresistive element,
said magnetoresistive element comprising a laminated structure comprising N (N is an integer not smaller than 3) magnetic layers and N−1 nonmagnetic layers that are alternately laminated,
wherein respective magnetization states of said N magnetic layers depend on N input data that are input to said logic gate,
a resistance value of said magnetoresistive element varies depending on the respective magnetization states of said N magnetic layers, and
an output data of said logic gate varies depending on said resistance value of said magnetoresistive element,
said method comprising:
inputting a part of said N input data to set a magnetization state of a magnetic layer associated with said part of the N input data among said N magnetic layers; and
inputting remainder of said N input data to output said output data.

12. A magnetoresistive element comprising:
N (N is an integer not smaller than 3) magnetic layers; and
N−1 nonmagnetic layers,
wherein said N magnetic layers and said N−1 nonmagnetic layers are alternately laminated,
wherein each of said N magnetic layers comprises:
a first magnetization fixed region whose magnetization direction is fixed in a first direction;
a second magnetization fixed region whose magnetization direction is fixed in a second direction opposite to said first direction; and
a magnetization switching region provided between said first magnetization fixed region and said second magnetization fixed region,
wherein a magnetization direction of said magnetization switching region is switched between said first direction and said second direction, by domain wall motion driven by a current flowing between said first magnetization fixed region and said second magnetization fixed region.

13. The magnetoresistive element according to claim 12,
wherein each of said N magnetic layers is formed of a perpendicular magnetic film having perpendicular magnetic anisotropy.

14. The magnetoresistive element according to claim 12,
wherein said first magnetization fixed region and said second magnetization fixed region of said each magnetic layer are respectively connected to a first current supply terminal and a second current supply terminal through contacts,
wherein said current is supplied to said each magnetic layer through said first current supply terminal and said second current supply terminal.

15. The magnetoresistive element according to claim 14,
wherein said N magnetic layers are so formed as to extend in a same in-plane direction, and
respective lengths of said N magnetic layers in said same in-plane direction become larger from an upper layer towards a lower layer.

16. The magnetoresistive element according to claim 14,
wherein said N magnetic layers are so formed as to extend in respectively different in-plane directions.

* * * * *